(12) United States Patent
Choi

(10) Patent No.: US 9,472,462 B2
(45) Date of Patent: Oct. 18, 2016

(54) METHOD OF MANUFACTURING 3D SEMICONDUCTOR INTEGRATED CIRCUIT DEVICE

(71) Applicant: SK hynix Inc., Gyeonggi-do (KR)

(72) Inventor: Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/488,084

(22) Filed: Sep. 16, 2014

(65) Prior Publication Data

US 2015/0364381 A1 Dec. 17, 2015

(30) Foreign Application Priority Data

Jun. 11, 2014 (KR) .................. 10-2014-0070977

(51) Int. Cl.
| | |
|---|---|
| *H01L 21/8238* | (2006.01) |
| *H01L 21/8234* | (2006.01) |
| *H01L 29/66* | (2006.01) |
| *H01L 29/45* | (2006.01) |
| *H01L 29/423* | (2006.01) |
| *H01L 29/417* | (2006.01) |
| *H01L 21/265* | (2006.01) |
| *H01L 29/08* | (2006.01) |
| *H01L 21/311* | (2006.01) |

(52) U.S. Cl.
CPC . *H01L 21/823487* (2013.01); *H01L 21/26513* (2013.01); *H01L 21/31111* (2013.01); *H01L 21/823418* (2013.01); *H01L 29/0847* (2013.01); *H01L 29/41741* (2013.01); *H01L 29/42356* (2013.01); *H01L 29/45* (2013.01); *H01L 29/665* (2013.01); *H01L 29/66666* (2013.01)

(58) Field of Classification Search
CPC ............... H01L 21/823487; H01L 29/66666; H01L 21/28518; H01L 21/823418; H01L 21/823425
USPC ......... 438/212, 268; 257/328, 329, E29.262, 257/E29.264, E29.274, E21.375, E21.629
See application file for complete search history.

(56) References Cited

U.S. PATENT DOCUMENTS

| | | | |
|---|---|---|---|
| 2001/0049165 A1* | 12/2001 | Ni ................................ 438/201 |
| 2006/0046392 A1* | 3/2006 | Manning et al. ............. 438/268 |
| 2010/0216289 A1* | 8/2010 | Park et al. .................... 438/268 |
| 2010/0291743 A1* | 11/2010 | Nishi et al. ................... 438/268 |
| 2011/0156134 A1* | 6/2011 | Kim .............................. 257/329 |
| 2013/0146964 A1* | 6/2013 | Masuoka et al. ............. 257/329 |

FOREIGN PATENT DOCUMENTS

| | | |
|---|---|---|
| KR | 1020080113858 | 12/2008 |
| KR | 101087936 101 | 11/2011 |

* cited by examiner

*Primary Examiner* — Kimberly Rizkallah
*Assistant Examiner* — Maria Ligai
(74) *Attorney, Agent, or Firm* — IP & T Group LLP

(57) ABSTRACT

A method of manufacturing a semiconductor integrated circuit device is provided. The method includes forming a plurality of pillars in a semiconductor substrate, forming an insulating layer between the plurality of pillars in such a manner that an upper region of each pillar protrudes, forming a silicide layer on an exposed surface of the pillar, and forming an insulating layer for planarization in a space between pillars.

16 Claims, 18 Drawing Sheets

METHOD OF MANUFACTURING 3D SEMICONDUCTOR INTEGRATED CIRCUIT DEVICE

CROSS-REFERENCES TO RELATED APPLICATION

This application claims priority under 35 U.S.C. 119(a) to Korean application No. 10-2014-0070977, filed on Jun. 11, 2014, in the Korean intellectual property Office, which is incorporated by reference in its entirety as set forth in full.

BACKGROUND

1. Technical Field

The inventive concept relates to a method of manufacturing a three dimensional (3D) semiconductor integrated circuit device, and more particularly, to a switching device of a 3D semiconductor integrated circuit device.

2. Related Art

Memory devices are generally provided as internal semiconductor integrated circuit devices of computers or other electronic apparatuses. As is well-known, typical examples of memory devices include random access memories (RAMs), read only memories (ROMs), dynamic RAMs (DRAMs), synchronous DRAM (SDRAM), flash memories, and variable resistive memory devices. Variable resistive memory devices include programmable conductive memory devices, resistive RAMs (ReRAMs), and phase-change RAMs (PCRAMs).

Nonvolatile memory devices, such as PCRAMs, may be used in broad electronic applications to provide high integration density, high reliability, and low power consumption.

The variable resistive memory devices may include a plurality of memory cells arranged in matrix form. The memory cell may include an access device such as a diode, an electric field effect (FET) transistor, or a bipolar junction transistor (BJT), and may be coupled to a word line arranged along a row direction of an array. Memory elements in the memory cells may be coupled to a bit line arranged in a column direction of the array. Through this manner, the access device of the memory cell may select a word line coupled to a gate. The memory cell may be accessed through a row decoder which activates the row of the memory cell.

Currently, transistors having a 3D vertical channel structure are used as the access device of memory cells to increase integration density. As is well-known, transistors having 3D vertical channel structures include pillar-shaped active regions, gates formed on a circumference of the active region, drains formed in an upper portion of the active region and at a higher level than the gates, and sources formed in a lower portion of the active region and at a lower level than the gate or formed in a semiconductor substrate which is in contact with the lower portion of the active region. A heating electrode and a variable resistance layer electrically coupled to a bit line are further formed on the transistor. To facilitate ohmic contact between the drain and the heating electrode, an ohmic contact layer, for example, a silicide layer, is formed between the drain and the heating electrode.

Endeavors for improving the operation current in variable resistive memory devices using 3D transistors as access devices continue, and various methods for improving the operation current have been suggested.

SUMMARY

According to an embodiment, there is provided a method of manufacturing a semiconductor integrated circuit device. The method may include forming a plurality of pillars in a semiconductor substrate having a first conductivity type, forming a first Insulating layer between the plurality of pillars in such a manner that an upper portion of each of the plurality of pillars protrudes over the first insulating layer, forming a silicide layer over the upper portion of the plurality of pillars, and forming a second insulating layer between the plurality of pillars in which silicide layers are formed.

According to an embodiment, there is provided a method of manufacturing a semiconductor integrated circuit device. The method may include forming a plurality of pillars in a semiconductor substrate having a first conductivity type, forming a gate surrounding a circumference of each of the plurality of pillar; forming a preliminary common source region in the semiconductor substrate between the gate and a neighboring gate, wherein the preliminary common source region is provided between the plurality of pillars, forming a drain in an upper portion of each of the plurality of pillars, wherein the drain is located at a level higher than the gate, filling a first insulating layer between the plurality of pillars in such a manner that a drain which is formed in each of the plurality of the pillars protrudes over the first insulating layer, forming a silicide layer over the drain, forming a second insulating layer filling in a space between the plurality of pillars, and forming a lower electrode coupled to the silicide layer.

According to an embodiment, there is provided a method of manufacturing a semiconductor integrated circuit device. The method may include forming a pillar extending from a semiconductor substrate, the pillar including a lower portion, a middle portion and an upper portion, forming a gate over a sidewall of the middle portion of the pillar, forming a first high concentration impurity region in the upper portion of the pillar, forming a second high concentration impurity region along a surface of the first high concentration impurity region, forming a conductive layer over the second high concentration impurity region, and performing heat treatment to react the conductive layer and the second high concentration impurity region to form a silicide layer.

The method may further comprises forming a preliminary common source region in the substrate between the pillar and a neighboring pillar, wherein impurities included in the preliminary common source region are diffused during the heat treatment to form a common source, and wherein the common source is commonly coupled to the lower portion of the pillar and a lower portion of the neighboring pillar.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1A:
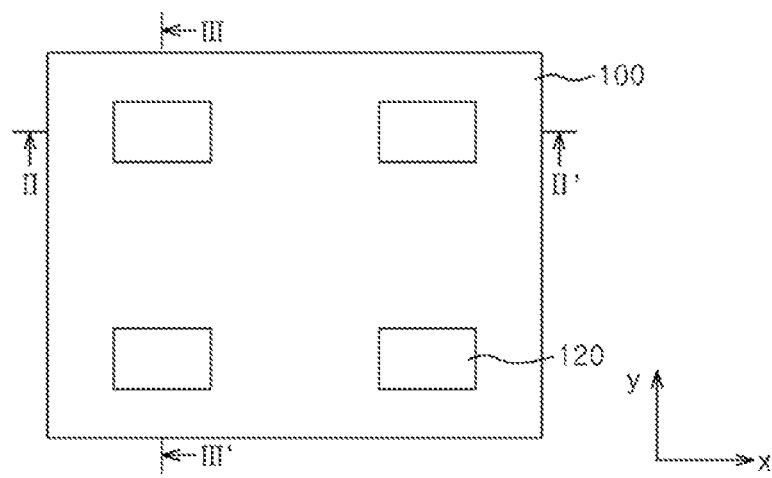
FIGS. 1A to 1L are plan views illustrating a method of manufacturing a semiconductor integrated circuit device according to an embodiment.

Exemplary embodiments will be described in greater detail with reference to the accompanying drawings. Exemplary embodiments are described herein with reference to cross-sectional illustrations that are schematic Illustrations of exemplary embodiments (and intermediate structures). As such, variations from the shapes of the illustrations depending on, for example, manufacturing techniques and/or tolerances are to be expected. Thus, exemplary embodiments should not be construed as limited to the particular shapes illustrated but may include deviations that may result, for example, from manufacturing techniques. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present.

Figure 2A:
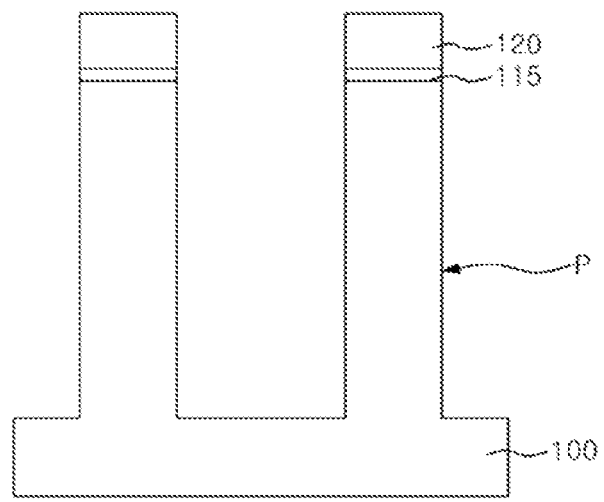
FIGS. 2A to 2L are cross-sectional views illustrating the method of manufacturing a semiconductor integrated circuit device taken along line II-II' of FIGS. 1A to 1L.
Figure 3A:
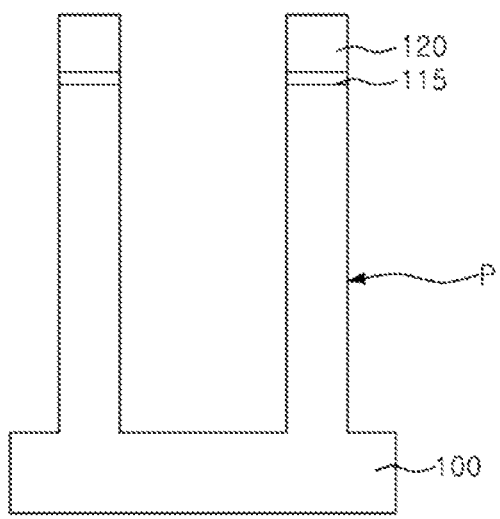
FIGS. 3A to 3L are cross-sectional views illustrating the method of manufacturing a semiconductor integrated circuit device taken along line III-III' of FIGS. 1A to 1L.

Referring to FIGS. 1A, 2A, and 3A, a pad insulating layer 115 and a hard mask layer 120 are sequentially formed on a semiconductor substrate 100. Predetermined portions of the hard mask layer 120 and the pad insulating layer 115 may be patterned to define an active region. The semiconductor substrate 100 may be etched by a predetermined depth using the patterned hard mask layer 120 as a mask pattern to form an active pillar P. The active pillar P may be formed by etching the semiconductor substrate 100 by a predetermined depth, but the method of forming the active pillar is not limited thereto. The active pillar may be formed by forming an additional semiconductor layer (not shown) on the semiconductor substrate 100 and etching the additional semiconductor layer. Further, in an embodiment, the semiconductor substrate 100 may be a silicon substrate having a first conductivity type.

Figure 1B:
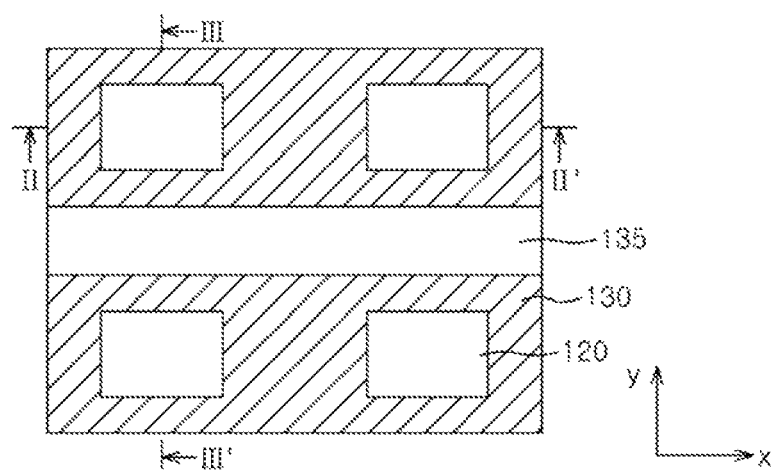
Figure 2B:
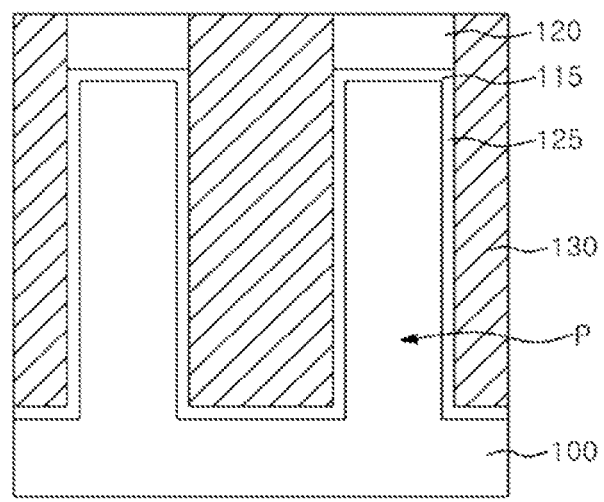
Figure 3B:
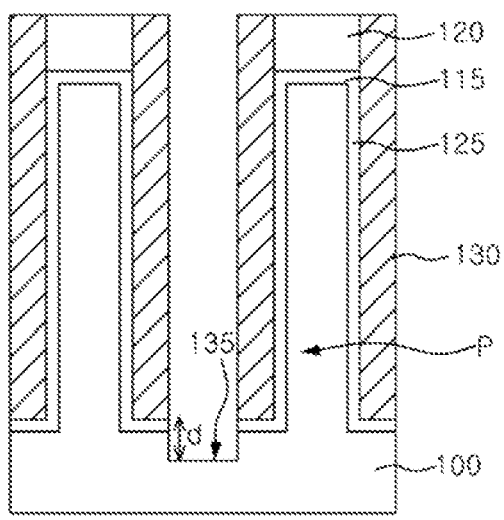

Referring to FIGS. 1B, 2B, and 3B, a gate insulating layer 125 may be formed on an exposed sidewall surface of the active pillar P. The gate insulating layer 125 may include, for example, a silicon oxide material. A gate material layer 130 is formed on the semiconductor substrate 100 in which the gate insulating layer 125 is formed. The gate material layer 130 may be formed along the surface of the active pillar P. When a distance between active pillars P is sufficiently narrow, the gate material layer 130 may be formed in a buried form in a space between the active pillars P.

A predetermined portion of the gate material layer 130 is etched to expose a predetermined portion of the semiconductor substrate 100, forming a gate extending in an x-direction as shown in FIG. 1B. Alternatively, the gate material layer 130 may be anisotropically etched to expose the predetermined portion of the semiconductor substrate 100, forming the gate material layer 130 surrounding a circumference of the active pillar P. The etch process for exposing the semiconductor substrate 100 may be performed through an over etching process by considering the thickness of the gate material layer 130. In the over etching process, the semiconductor substrate 100 may be additionally etched by a predetermined depth d. An exposed region 135 of the semiconductor substrate may be a node separation region for separation between cells. For example, the node separation region 135 may extend to the x-direction of FIG. 1B and be substantially in parallel to the remaining gate material layer 130.

Figure 1C:
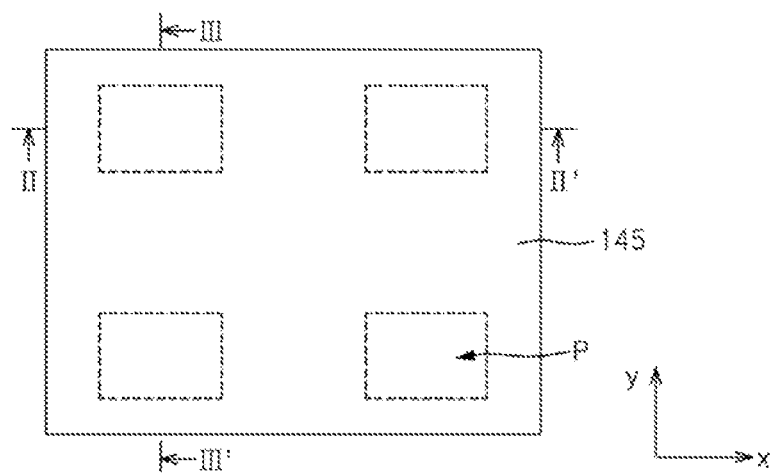
Figure 2C:
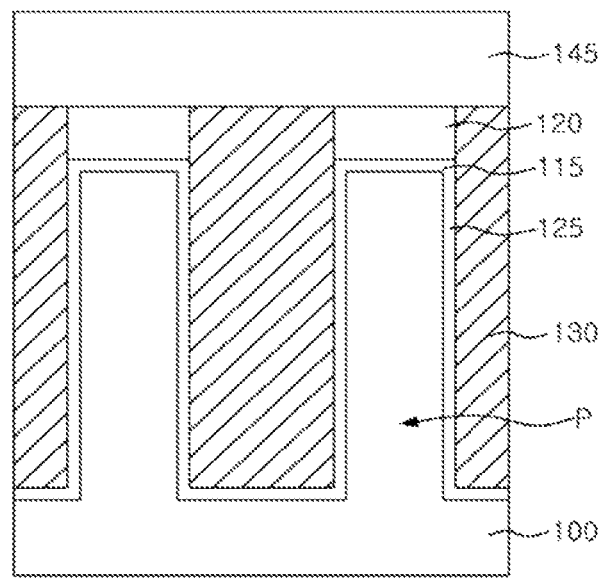
Figure 3C:
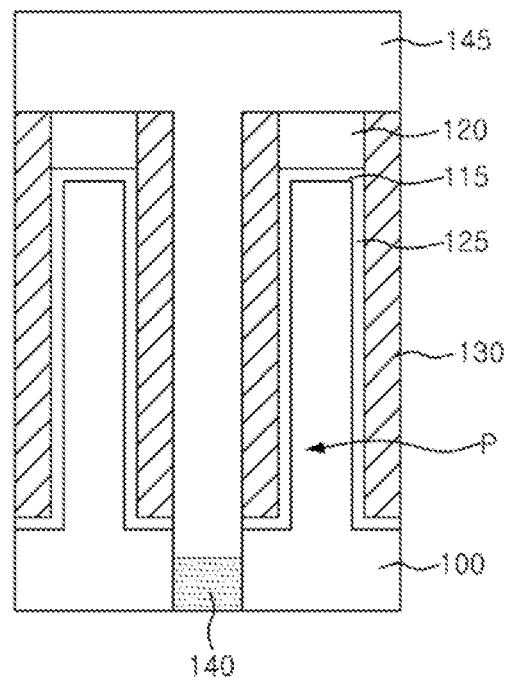

Referring to FIGS. 1C, 2C, and 3C, a preliminary common source region 140 is formed by implanting Impurities into the exposed node separation region 135. The impurities may have a second conductivity type opposite to the first conductivity type. The impurities may have substantially the same concentration as a source which will be formed later. A first interlayer insulating layer 145 is formed on the semiconductor substrate 100 in which the preliminary common source region 140 is defined. The first interlayer insulating layer 145 may be formed to a thickness sufficient to gap-fill a space between gate material layers.

Figure 1D:
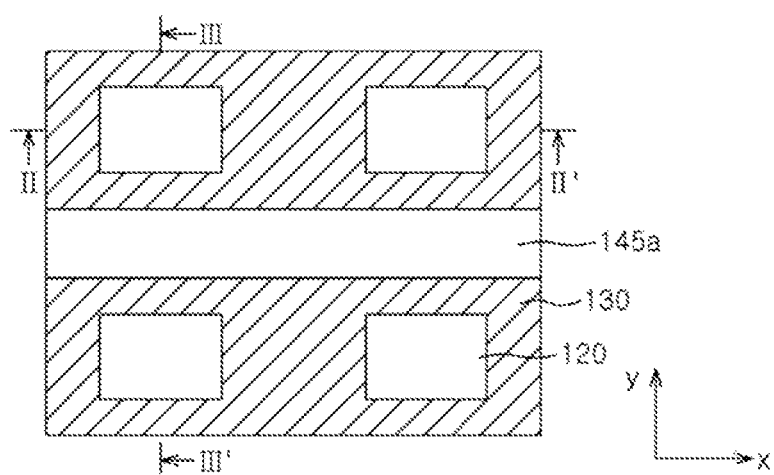
Figure 2D:
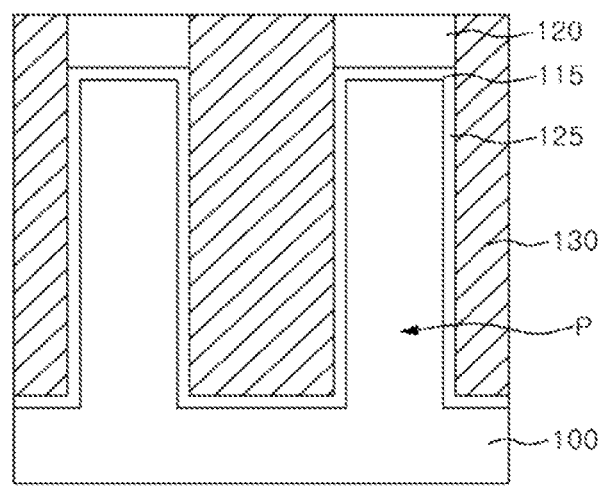
Figure 3D:
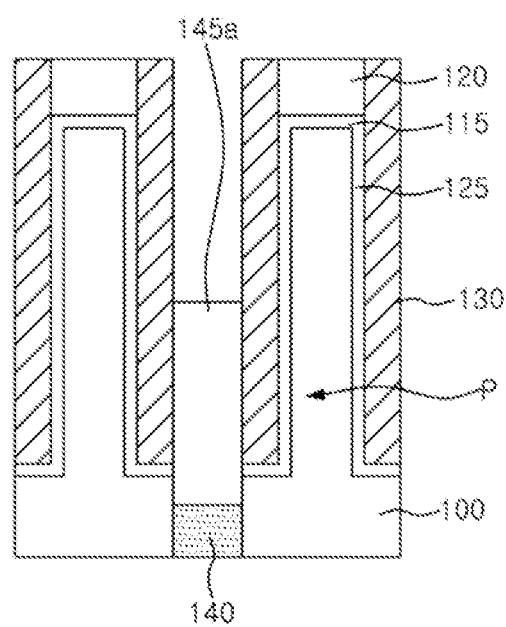

Referring to FIGS. 1D, 2D, and 3D, the first interlayer insulating layer 145 is recessed by a predetermined thickness to define a gate mask 145a. An upper surface of the gate mask 145a may be located at a lower level than an upper surface of the active pillar P, and may be provided to control a height of the gate material layer 130.

Figure 1E:
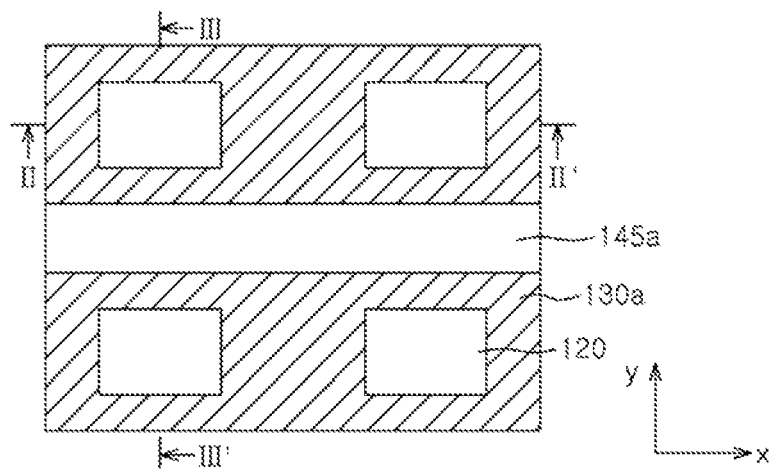
Figure 2E:
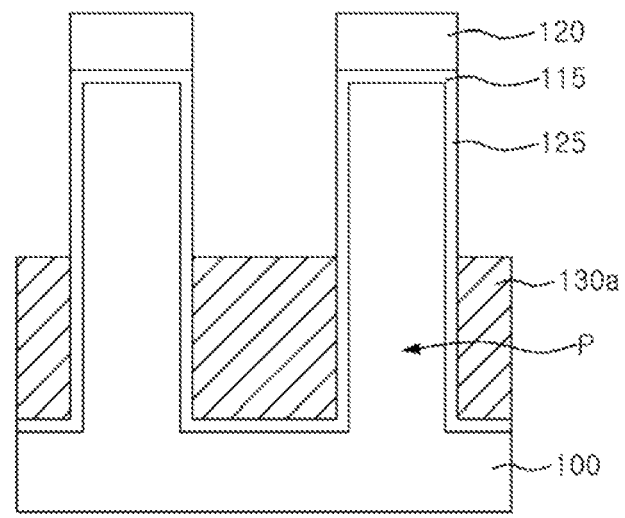
Figure 3E:
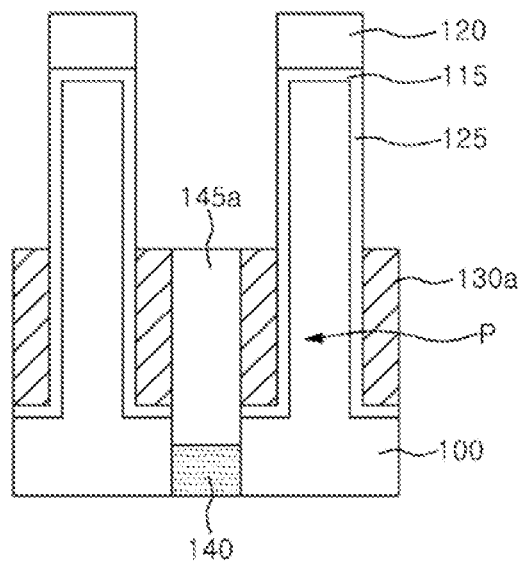

Referring to FIGS. 1E, 2E, and 3E, the gate material layer 130 is recessed by a predetermined thickness using the gate mask 145a to form a gate 130a. In an embodiment, the gate 130a may be referred to as a word line. The gate 130a may extend up to the same level as the upper surface of the gate mask 145a, and the gate mask 145a may be formed of an insulating material. Therefore, gates 130a extending in parallel to the x-direction of FIG. 1E may be insulated by the gate mask 145a. An upper sidewall of the active pillar P may be exposed through the formation of the gate 130a.

Figure 1F:
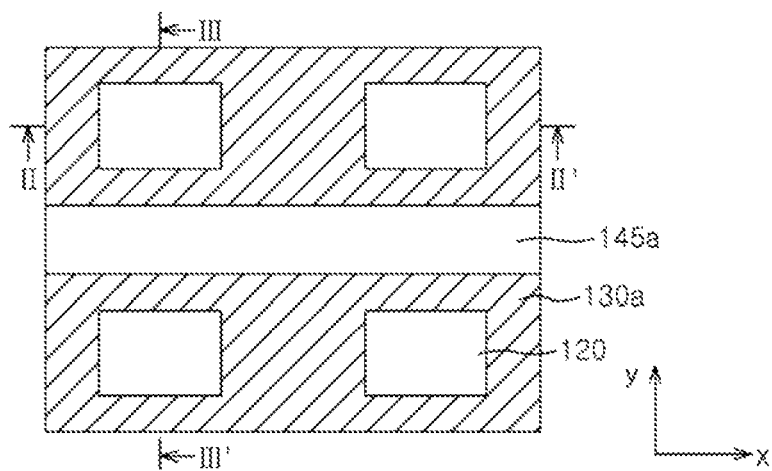
Figure 2F:
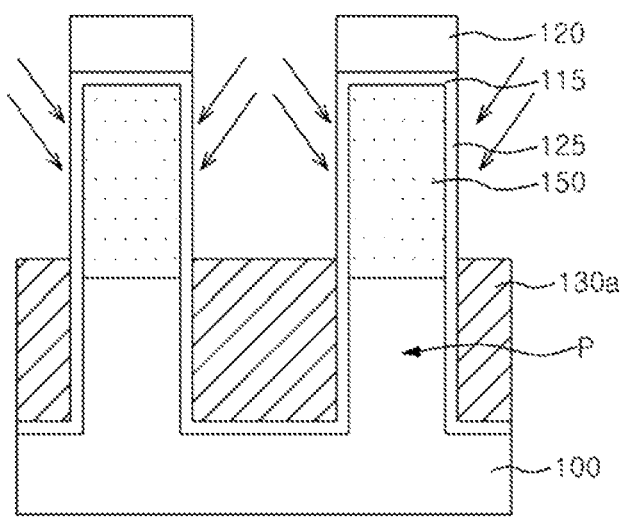
Figure 3F:
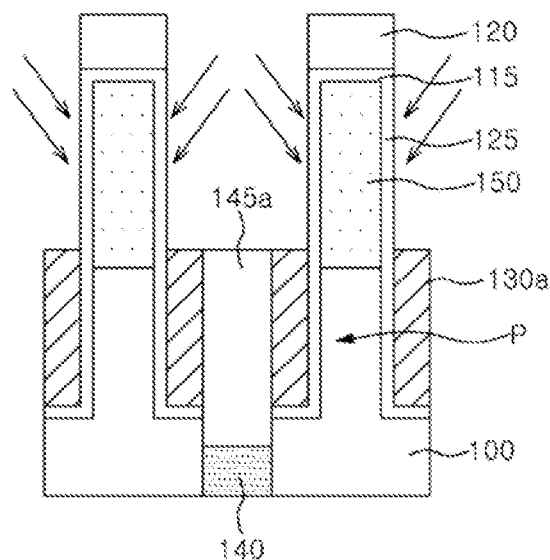

Referring to FIGS. 1F, 2F, and 3F, lightly doped drain (LDD) ions are implanted into the upper sidewall of the active pillar P which is exposed by the gate 130a to form a first LDD region 150. The LDD ions may be implanted through a tilt ion Implantation process, and may have the second conductivity type.

Figure 1G:
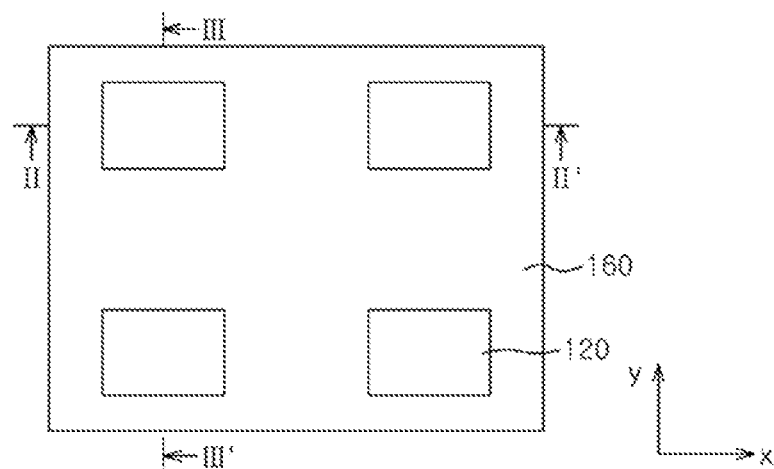
Figure 2G:
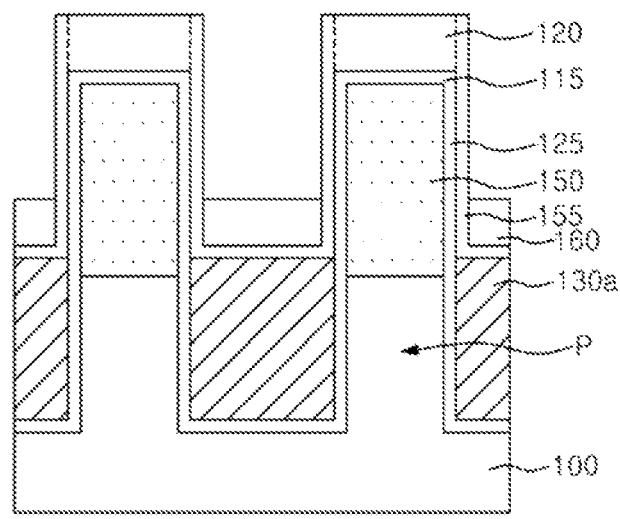
Figure 3G:
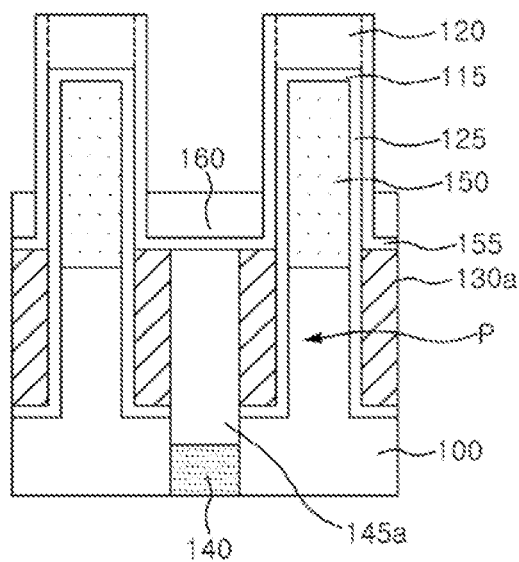

Referring to FIGS. 1G, 2G, and 3G, a liner 155 formed of, for example, a silicon nitride layer is formed on the upper sidewall of the active pillar P and on the gate 130a and the gate mask 145a. A second interlayer insulating layer 160 is formed on the liner 155 and may be, for example, silicon nitride. The second interlayer insulating layer 160 may be formed to a thickness sufficient to fill a space between the active pillars P, and recessed by a predetermined thickness to expose the upper sidewall of the active pillar P where a drain is formed in a subsequent process.

Figure 1H:
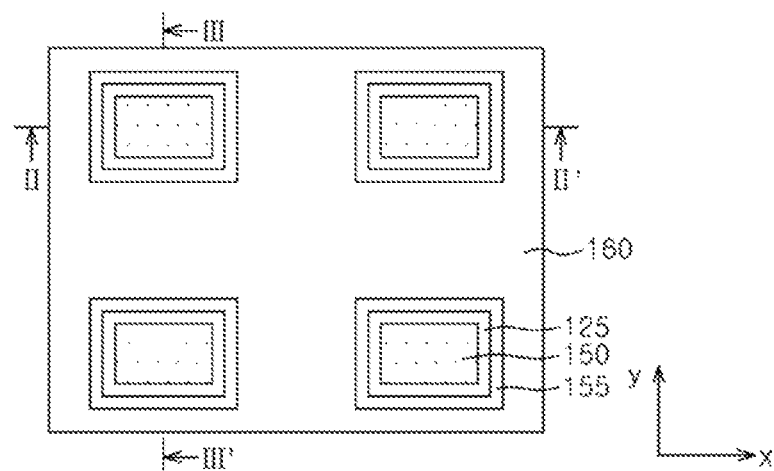
Figure 2H:
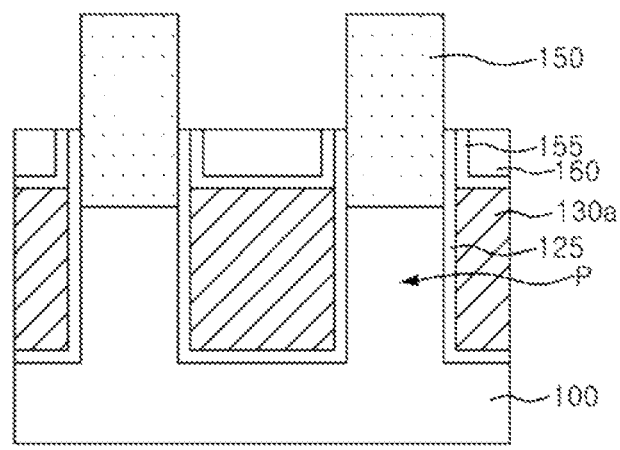
Figure 3H:
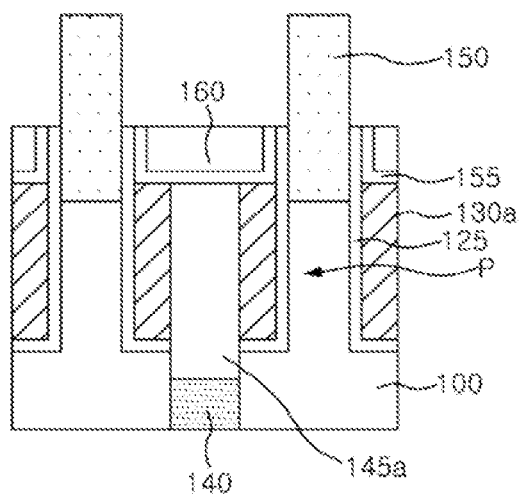

Referring to FIGS. 1H, 2H, and 3H, the hard mask layer 120 and the pad oxide layer 115 and portions of the gate insulating layer 125 and the liner 155, which are exposed by the second interlayer insulating layer 160, are removed. Therefore, an upper portion of the bare active pillar P may be exposed.

Figure 1I:
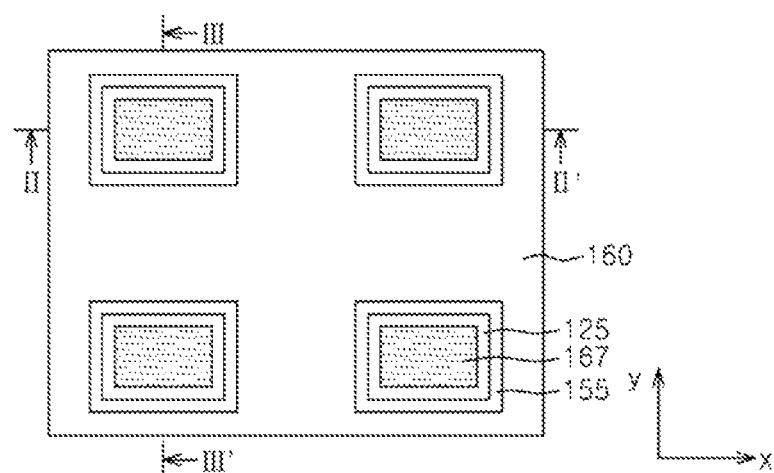
Figure 2I:
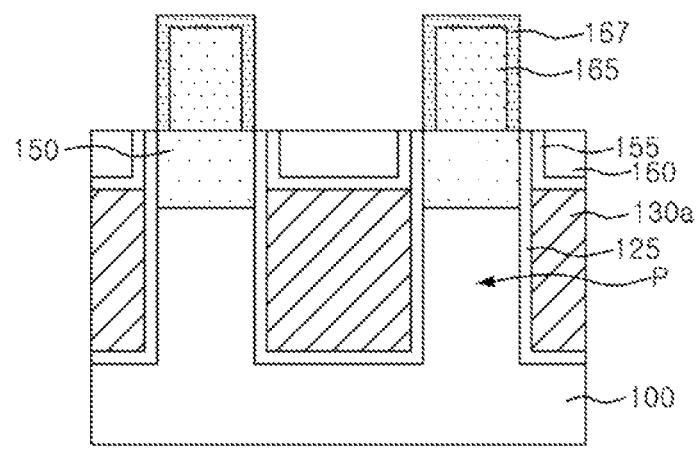
Figure 3I:
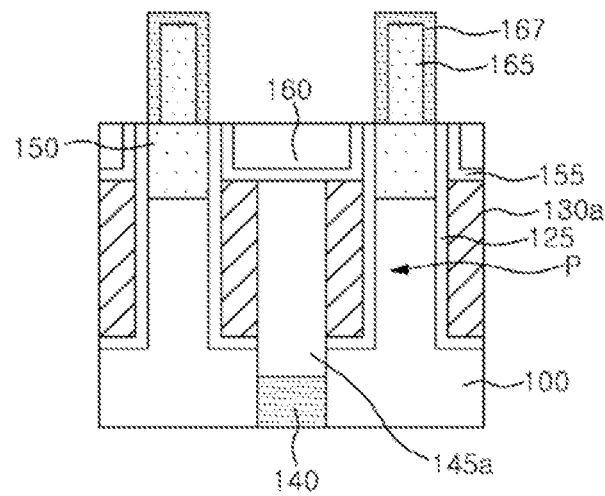

Referring to FIGS. 1I, 2I, and 3I, a first high concentration impurity region 165 is formed by implanting impurities having the second conductivity type into the exposed upper portion of the active pillar P, more specifically, into the first LDD region 150 of the active pillar P. A second high concentration impurity region 167 may be formed by shallowly implanting a second high concentration impurity having the second conductivity type into a surface of the first high concentration region 165. The second high concentration impurity region 167 may have a higher impurity concentration than the first high concentration impurity region 165, and thus may serve to reduce contact resistance, with a silicide layer that will be formed later, and ohmic contact resistance. For example, the second high concentration impurity region 167 may substantially have the same concentration as the preliminary common source region 140.

Figure 1J:
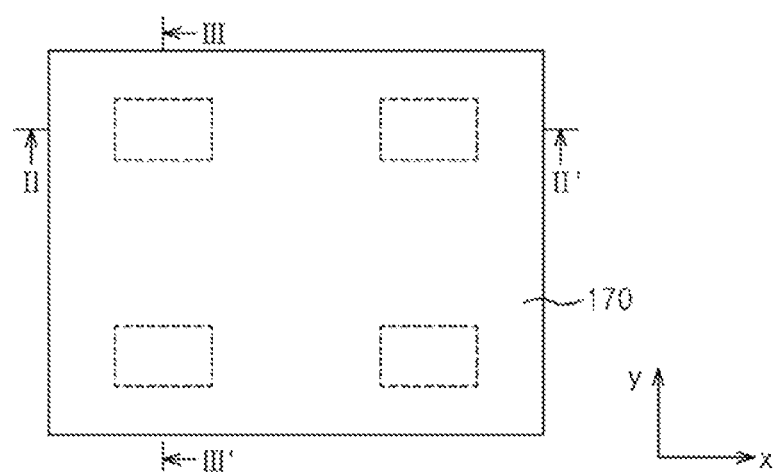
Figure 2J:
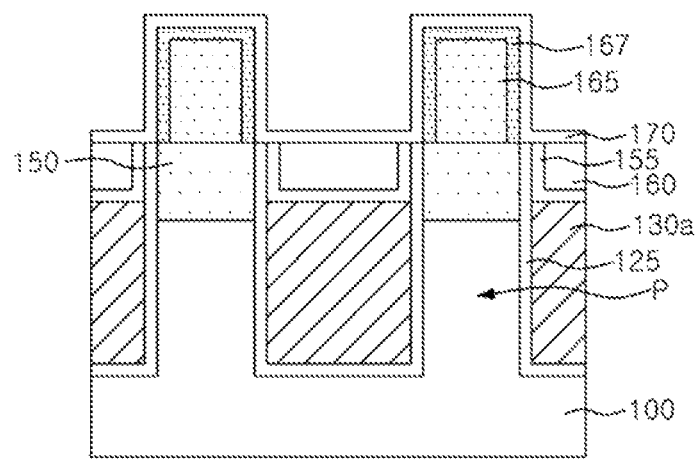
Figure 3J:
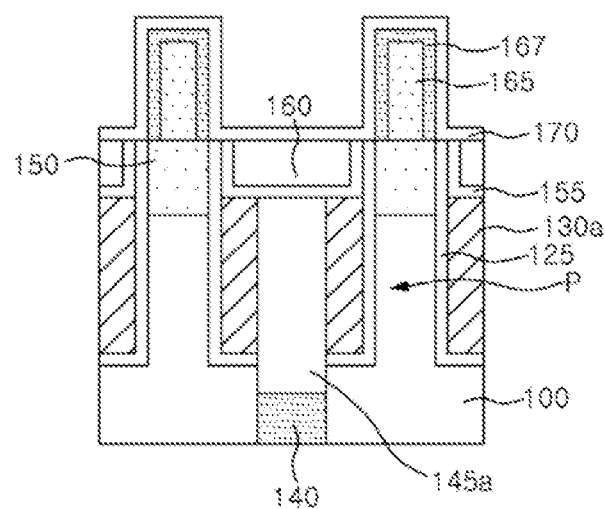

Referring to FIGS. 1J, 2J, and 3J, a transition metal layer 170 is coated on the pillar P and the second interlayer insulating layer 160. The transition metal layer 170 may be uniformly formed on top in a liner pattern and on an entire lateral surface of the active pillar P. For example, the transition metal layer 170 may include a titanium layer.

Figure 1K:
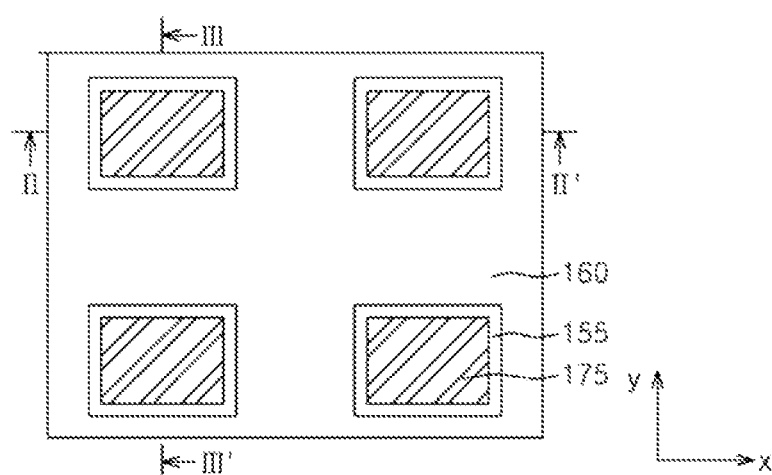
Figure 2K:
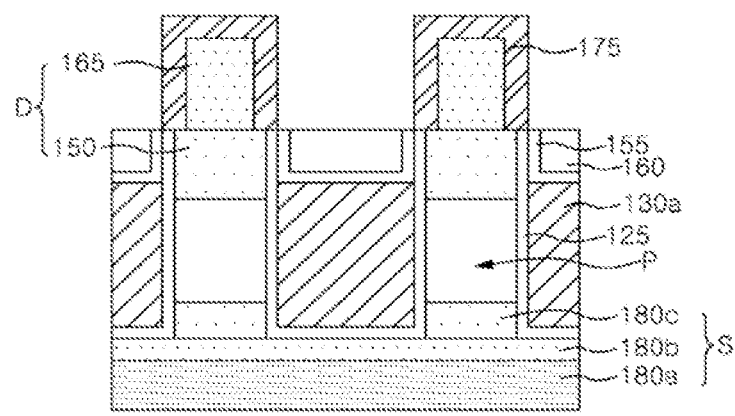
Figure 3K:
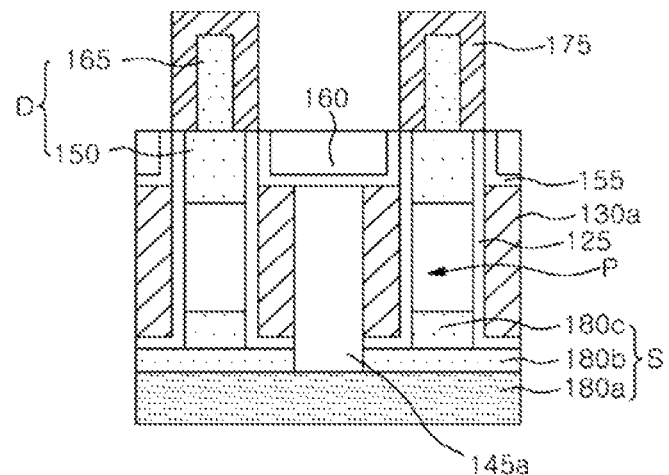

Referring to FIGS. 1K, 2K, and 3K, an activation process is performed on the semiconductor substrate 100 on which the transition metal layer 170 is transformed to a silicide layer 175 on the top and entire lateral surface of the pillar P. As is well-known, a silicide reaction is performed between a silicon material and a transition metal layer material, and thus the silicide layer 175 may be formed only on the surface of the pillar P including a silicon material. In the activation treatment for the silicide reaction, impurities of the preliminary common source region 140 may be diffused, so a third high concentration impurity region 180a, a fourth high concentration impurity region 180b, and a second LDD region 180c are spontaneously formed. The third high concentration impurity region 180a is located close to the preliminary common source region 140, and thus the third high concentration impurity region 180a may have a higher concentration than the fourth high concentration impurity region 180b. The third and fourth high concentration impurity regions 180a and 180b may be formed in the entire semiconductor substrate to extend through a lower portion of the active pillar P. Thus, a drain D of a vertical transistor is defined by the first LDD region 150 and the first high concentration impurity region 165, and a source S of the vertical transistor is defined by the third high concentration impurity region 180a, the fourth high concentration impurity region 180b, and the second LDD region 180c. The non-reacted transition metal layer 170 in FIGS. 1J, 2J, and 3J may be removed.

Figure 1L:
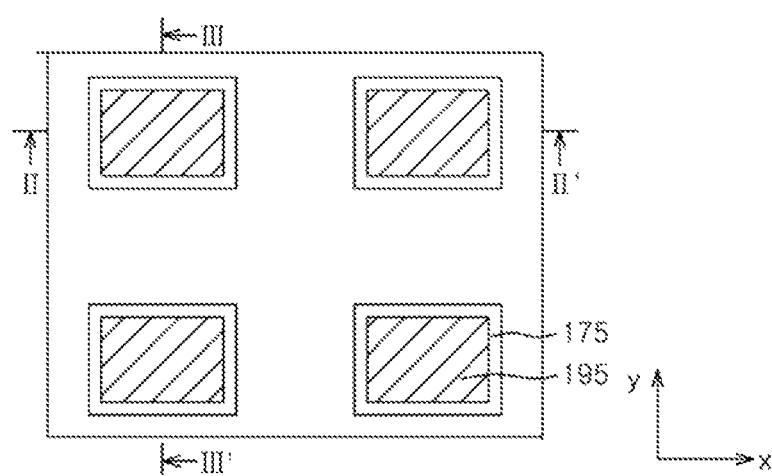
Figure 2L:
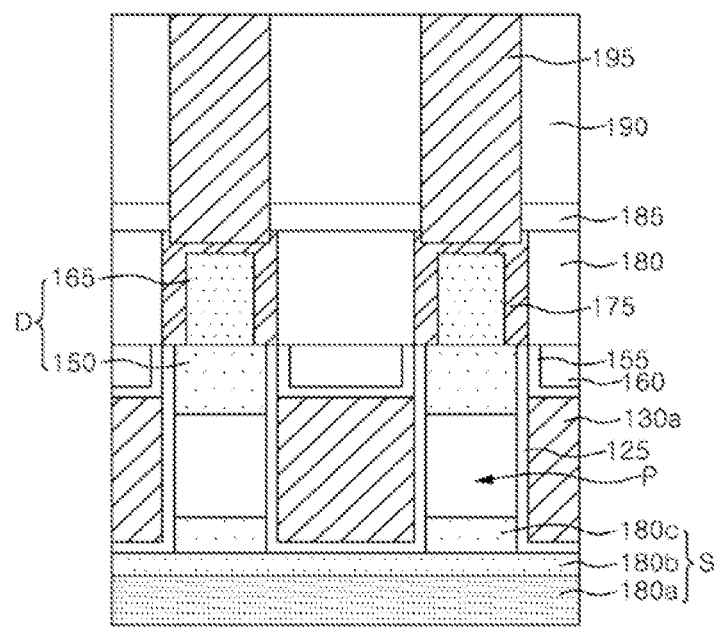
Figure 3L:
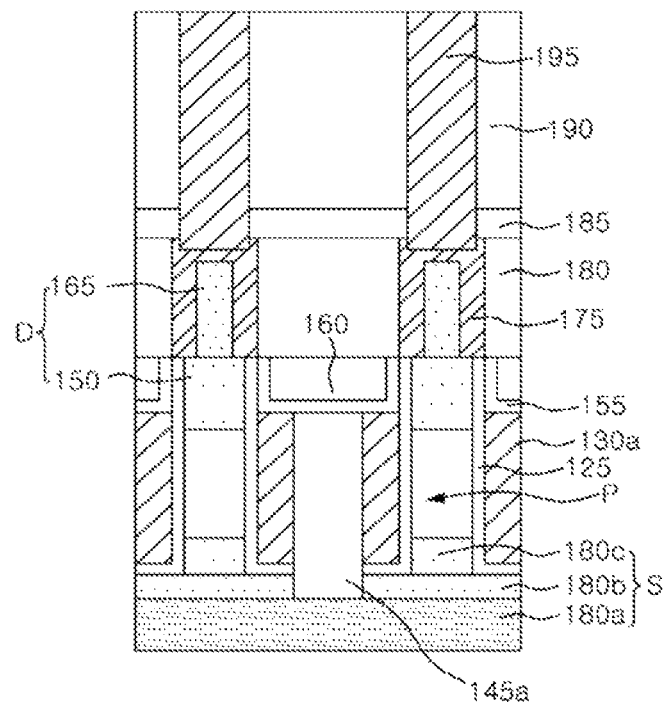

Referring to FIGS. 1L, 2L, and 3L, a first planarization insulating layer 180 is formed on the semiconductor substrate 100 in which the source S and the drain D are defined. The first planarization insulating layer 180 may be planarized to expose a surface of the silicide layer 175 on the pillar P. An etch stopper 185 is formed on the first planarization insulating layer 180. A second planarization insulating layer 190 is formed on the etch stopper 185. The second planarization insulating layer 190 is etched to expose the etch stopper 185 located on the pillar P, and the exposed etch stopper 185 is selectively removed to form a lower electrode region (not shown) exposing the silicide layer 175. Subsequently, a conductive material is filled within the lower electrode region to form a lower electrode 195. Although not shown in FIGS. 1L, 2L, and 3L, a variable resistance layer, for example, a phase-change layer may be formed on the lower electrode 195.

According to an embodiment, a silicide layer may be formed on a top and a circumference of an upper portion of a pillar to form a drain region of a vertical transistor in a cap form, reducing contact resistance.

In an embodiment, the silicide layer is formed in a manner surrounding the pillar protruding outside before a first planarization insulating layer is formed. Thus, the silicide layer is easily formed on an upper surface and a sidewall surface of the pillar P.

In conventional art, a pillar structure is buried in a planarized insulating layer. The silicide formation region is formed by etching the planarized insulating layer to expose an upper surface and a sidewall of the pillar. However, according to an embodiment, the additional etching process for forming a silicide formation region (an upper surface and a sidewall surface of the pillar P) is unnecessary because the silicide layer 175 is formed by reacting the second high concentration impurity region 167 and the transition metal layer 170 coated on the second high concentration impurity region 167.

The pillar protruding outwards may be formed with in a self-aligned manner, and thus an additional process for protruding the pillar is not necessary.

The above embodiments are illustrative and not limitative. Various alternatives and modifications are possible that would fail within the spirit and scope of the appended claims.

What is claimed is:

1. A method of manufacturing a three dimensional (3D) semiconductor integrated circuit device, the method comprising:
    forming a plurality of pillars in a semiconductor substrate having a first conductivity type;
    forming a first insulating layer between the plurality of pillars in such a manner that an upper surface and an upper sidewall of each of the plurality of pillars protrudes over the first insulating layer;
    forming a drain in the upper portion of each of the plurality of pillars;
    forming a silicide layer over the upper surface and the upper sidewall of each of the plurality of pillars; and
    forming a second insulating layer in a space between the plurality of pillars,
    wherein the forming of the drain includes:
        forming a lightly doped drain (LDD) region by implanting LDD impurities into an upper portion of each of the plurality of pillars;
        forming a first high concentration impurity region in the LDD region; and
        forming a second high concentration impurity region along a surface of the first high concentration impurity region.

2. The method of claim 1, further comprising: between the forming of the plurality of pillars and the forming of the first insulating layer,
    forming a gate insulating layer over an lower sidewall of each of the plurality of pillars; and
    forming a gate over the gate insulating layer, wherein the gate is located at a lower level than an upper surface of each of the plurality of pillars.

3. The method of claim 1, further comprising forming a preliminary common source region in the semiconductor substrate between the gate and a neighboring gate.

4. The method of claim 3, wherein the preliminary common source region is a high concentration impurity region having a second conductivity type opposite to the first conductivity type.

5. The method of claim 3, wherein the forming of the silicide layer includes:
    coating a transition metal layer over an upper surface of the drain and over a sidewall surface of the drain;
    performing a heat treatment on the semiconductor substrate so that the transition metal layer reacts with the second high concentration impurity region to form the silicide layer; and
    removing a non-reacted transition metal layer.

6. The method of claim 5, wherein impurities contained in the preliminary common source region are diffused during the heat treatment to form a common source,
    wherein the common source has a gradation in concentration distribution along a direction in which each of the plurality of pillars extends, and wherein the common source is formed in the semiconductor substrate and coupled to a lower portion of each of the plurality of pillars in common.

7. The method of claim 1, wherein the first high concentration impurity region is formed in an upper portion of the LDD region.

8. The method of claim 7, wherein the LDD region and the first and the second high concentration impurity regions respectively have a second conductivity type opposite to the first conductivity type.

9. A method of manufacturing a three dimensional (3D) semiconductor integrated circuit device, the method comprising:
   forming a plurality of pillars in a semiconductor substrate having a first conductivity type;
   forming a gate surrounding each of the plurality of pillars;
   forming a preliminary common source region in the semiconductor substrate between the gate and a neighboring gate, wherein the preliminary common source region is provided between the plurality of pillars;
   forming a drain in an upper portion of each of the plurality of pillars, wherein the drain is located at a level higher than the gate;
   filling a first insulating layer between the plurality of pillars in such a manner that the drain which is formed in each of the plurality of the pillars protrude over the first insulating layer;
   forming a silicide layer over an upper surface and a sidewall surface of the drain;
   forming a second insulating layer filling in a space between the plurality of pillars; and
   forming a lower electrode coupled to the silicide layer,
   wherein the forming of the drain includes:
      defining a first lightly doped drain (LDD) region by implanting LDD ions into the upper portion of each of the plurality of pillars exposed by the gate;
      forming the first insulating layer over the gate to expose an upper portion of the first LDD region; and
      forming a first high concentration impurity region by implanting a first high concentration impurity into the exposed first LDD region.

10. The method of claim 9, wherein the forming of the plurality of pillars includes forming the plurality of pillars by etching the semiconductor substrate to a predetermined depth.

11. The method of claim 10, wherein the forming of the gate includes:
   forming a gate insulating layer over a sidewall surface of the pillar;
   coating a gate conductive layer over the gate insulating layer; and
   forming a gate at a lower level than the drain by recessing the gate conductive layer to a predetermined depth.

12. The method of claim 9, further comprising forming a second high concentration impurity region by implanting a second high concentration impurity along a surface of the first high concentration impurity region,
   wherein the second high concentration impurity region has a higher concentration than the first high concentration impurity.

13. The method of claim 9, wherein the forming of the silicide layer includes:
   forming a transition metal layer over the drain of each of the plurality of pillars and the first insulating layer;
   forming the silicide layer by performing a heat treatment on the semiconductor substrate in which the transition metal layer is formed; and
   removing a non-reacted transition metal layer.

14. The method of claim 13,
   wherein impurities contained in the preliminary common source region are diffused during the heat treatment to form a common source, and
   wherein the common source is coupled to the plurality of pillars and provided in the semiconductor substrate in common.

15. The method of claim 9, wherein the forming of the second insulating layer includes:
   forming a first planarization insulating layer extending up to the same level as an upper portion of each of the plurality of pillars;
   forming an etch stopper over the first planarization insulating layer; and
   forming a second planarization insulating layer over the etch stopper.

16. The method of claim 15, wherein the forming of the lower electrode includes:
   etching a predetermined portion of the second planarization insulating layer to expose the etch stopper over the silicide layer;
   removing the exposed etch stopper to expose the silicide layer, defining a lower electrode region; and
   forming the lower electrode by filling the lower electrode region with a conductive material so that the lower electrode is coupled to the silicide layer.

* * * * *